United States Patent [19]

Sparks

[11] 4,340,861
[45] Jul. 20, 1982

[54] METHOD OF MEASURING MAGNETIC FIELD CHARACTERISTICS OF MAGNETIC MATERIALS

[75] Inventor: Richard A. Sparks, Bedford, Mass.

[73] Assignee: Raytheon Company, Lexington, Mass.

[21] Appl. No.: 126,260

[22] Filed: Mar. 3, 1980

[51] Int. Cl.³ .................... G01R 33/12; G01R 35/00; G01N 27/72; G01R 33/02
[52] U.S. Cl. .................................. 324/205; 324/202; 324/250
[58] Field of Search ............... 324/200, 202, 205, 244, 324/250, 260

[56] References Cited

U.S. PATENT DOCUMENTS

| | | | |
|---|---|---|---|
| 2,972,104 | 2/1961 | Ward | 324/250 |
| 2,975,360 | 3/1961 | Bell | 324/244 |
| 3,956,692 | 5/1976 | Weinberg | 324/202 |

OTHER PUBLICATIONS

Kaufman, Edwin N., "Magnetic Flux Comparator", Engineering Dept., Radio & Television News, Mar. 1950, pp. 20, 21.

*Primary Examiner*—Gerard R. Strecker
*Attorney, Agent, or Firm*—Denis G. Maloney; Joseph D. Pannone; Richard M. Sharkansky

[57] ABSTRACT

Bodies of a ferrimagnetic material are disposed within small cavities provided in a magnetometer. The magnetometer is initially calibrated utilizing an electromagnet to produce an applied magnetic field of either known field strength, $H_{DC}$, or known field distribution. Radio frequency energy is fed equally to each cavity and each material and results in resonance frequency output signals which may be coupled to a visual display. When the calibrating magnetic field is of known uniform strength, $H_{DC}$, the orientation of the bodies is changed until each of the resonance signals have a frequency substantially given by $f_c = \gamma H_{DC}$ where $\gamma = 2.8$ MHz/oersted. When the calibrating magnetic field has a known field distribution the orientation of bodies is changed until such resonance signals have frequencies related to one another in accordance with the relative magnetic field strengths passing through the cavities. After calibration, the electromagnet is replaced by a test fixture including a magnet, the magnetic properties of which are to be measured. Radio frequency energy signals are reintroduced into the cavities. The frequency $(f_M)$ of each of the output signals is then measured. The strength of magnetic field $(H_M)$ of the permanent magnet passing through the cavities is calculated in accordance with $H_M = f_M/\gamma$. The distribution of the magnetic field of the magnet under evaluation is determined by comparing frequencies of the output signals.

8 Claims, 7 Drawing Figures

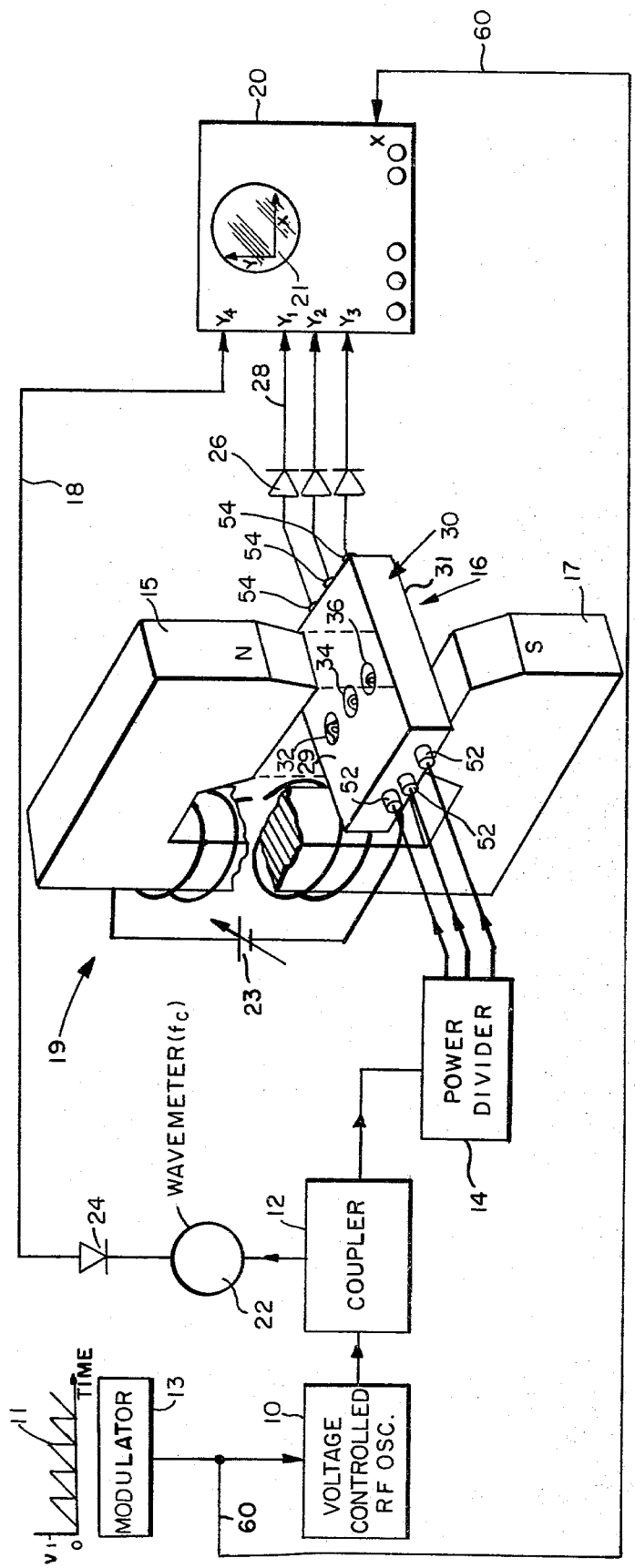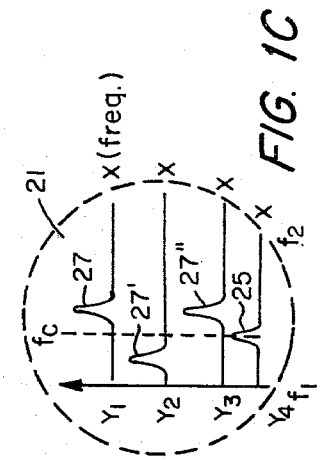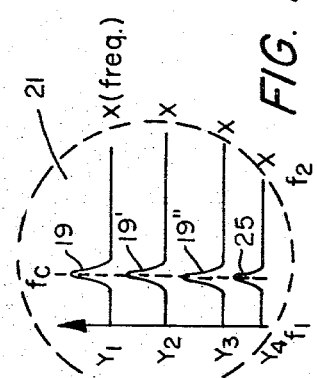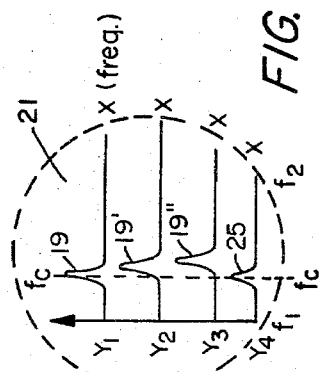

4,340,861

METHOD OF MEASURING MAGNETIC FIELD CHARACTERISTICS OF MAGNETIC MATERIALS

BACKGROUND OF THE INVENTION

The invention relates generally to methods and apparatus for measuring magnetic field strengths and field uniformity of permanent magnets.

As is known in the art, a magnetometer is an instrument for measuring the strength and uniformity of a magnetic field. A prior art measurement technique involves the use of Hall effect probes operating with direct or differential readouts to measure magnetic field strengths and the uniformity of such magnetic field strengths. The magnetic field strength is measured by the amount of current produced by the Hall effect probe when such probe is inserted into a magnetic field being measured. The Hall effect is defined in accordance with the equation $F=eBv$; where $F=$ the force; $e=$ the electric charge; $B=$ the magnetic field; and $v=$ the velocity of the electron charge. The Hall effect technique is based on the phenomenon which occurs when a thin sheet of metal or semiconductor with an electric current flowing along its length is placed at right angles to a magnetic field. An electromotive force is developed which is at right angles both to the direction of the magnetic field and the electric current. The Hall coefficient associated with the Hall effect takes place when the electromotive force results in a transverse potential gradient in a conductor or semiconductor. While such probe may be accurate in measuring magnetic field strengths and uniformities in some applications, in other applications such probes do not provide the requisite accuracy.

SUMMARY OF THE INVENTION

A method of and apparatus for measuring magnetic field properties of a permanent magnet. Initially, at least one body of a ferrimagnetic material, such as yttrium iron garnet (YIG) is disposed within a small cavity in apparatus such as a magnetometer for, illustratively, magnetic field strength measurement of a permanent magnet. During an initial calibration the magnetometer is positioned within a known applied magnetic field ($H_{DC}$) of, for example, an adjustable calibrating electromagnet with the field traversing the cavities. Radio frequency energy having a linearly modulated range of frequencies is fed to the YIG-cavity combination and a resonance frequency output signal is produced in the cavity and may be coupled out of such cavity for display on an oscilloscope. The time base or X-axis of the oscilloscope is generated to correspond to the frequency of radio frequency energy fed to the YIG-cavity combination. To measure magnetic field strength, the body of YIG material is orientated within the cavity until a resonance frequency output signal is produced having a frequency $f_c$ defined by the equation: $(f_c=\gamma H_{DC})$; $\gamma=$ the gyromagnetic ratio (2.8 MHz/oersted for YIG); and $H_{DC}=$ the applied magnetic field in oersteds. Such calibrated orientation indicates that the internal induced demagnetization field is effectively zero.

After the apparatus is calibrated the sphere is fixed in the orientated position as established by the calibration procedure. The apparatus is now utilized for evaluating magnetic field strength of a magnet by first removing the calibrating electromagnet and substituting in its place the magnet to be measured. Similary modulated radio frequency energy signals are fed into the cavities. The resonance frequency ($f_M$) of the output signal now produced is a measure of the magnetic field strength ($H_M$) in accordance with the equation: $(H_M=f_M/\gamma)$ which may be readily solved.

For a measurement of magnetic field distribution, the field distribution of the calibrating magnet is established. The spheres are oriented in the cavities to produce output signals having a frequency distribution related to the magnetic field distribution of the calibrating magnet. For example if the calibrating magnet produced a magnetic field having a field strength which linearly decreases across the cavities the spheres are orientated so that the frequencies of the output signals decreased linearly from cavity to cavity. With the spheres in the orientated positions the calibrating magnet is replaced with a magnetic field distribution of which is to be evaluated. The variations, in the frequency of the output signals are measured to provide an indication of magnetic field distribution of the magnet being investigated. In the example above if the plural output signal frequencies vary linearly from cavity to cavity the field distribution of the magnet under investigation is known to vary linearly across the cavities.

BRIEF DESCRIPTION OF THE DRAWINGS

The above-mentioned and other features of the invention will become more apparent after consideration of the following detailed description together with the accompanying drawings in which:

FIG. 1 is a diagrammatic view of the apparatus used to calibrate the magnetometer and measure the magnetic field of the permanent magnet;

FIGS. 1A, 1B and 1C are pictorial representations of the displayed output detector signals on the screen of an oscilloscope, FIGS. 1A and 1B being pictorial representations before and after, respectively, adjustment of the spheres in the cavities for calibration of the magnetometer and FIG. 1C being a pictorial representation after insertion in the magnetometer of a magnet the field strength of which is being measured;

DESCRIPTION OF THE PREFERRED EMBODIMENT

Figure 2:
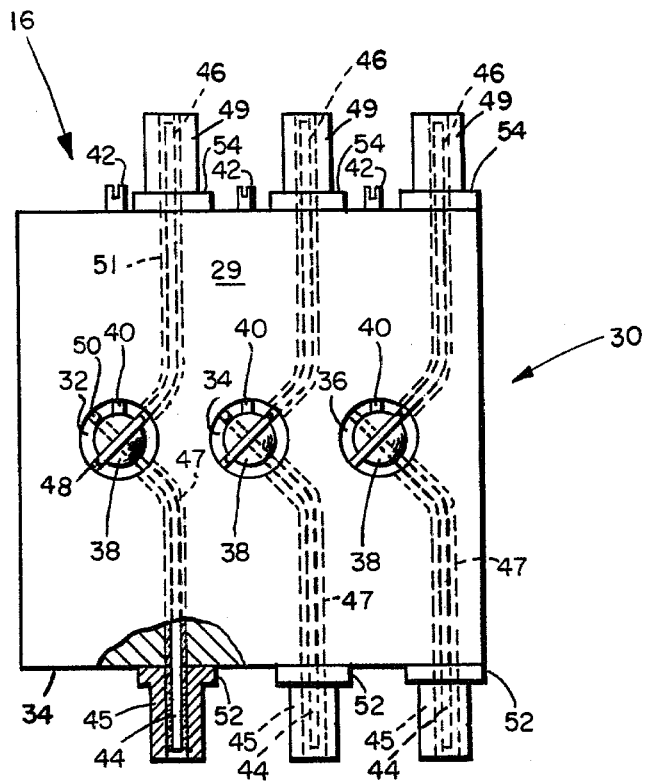
FIG. 2 is a top view of a magnetometer in accordance with the invention.

Referring now to FIG. 1 equipment used in the method of calibration of magnetometer 16 and in the method of measurement of the magnetic field of a magnet will be described. A voltage controlled radio frequency oscillator 10 is provided, illustratively a backward wave tube, fed by a modulator 13 which generates a sawtooth waveform 11, periodically linearly varying from zero volts to $v_1$ volts as shown. The sawtooth waveform 11 is fed to the radio frequency oscillator 10 which produces a radio frequency signal having a frequency linearly modulated through a range of frequencies $f_1$ to $f_2$, preselected on the basis of the end use for which the magnet to be measured is intended. The waveform 11 is also fed, via line 60, to the time or x axis of oscilloscope 20. Therefore the x axis of the oscilloscope 20 may be considered as the "frequency axis." The radio frequency signal produced by oscillator 10 is fed to coupler 12. One branch of the coupler 12 is coupled to the ($Y_4$) vertical axis of oscilloscope 20 by line 18 through a narrow band filter, here a frequency wavemeter 22 which is tuned to a substantially precise frequency ($f_c$) selected in the range $f_1$ to $f_2$ based on the intended device end use, and a video detector 24, as shown. Therefore as the frequency of the oscillator 10 passes through the frequency ($f_c$) a pulse 25 is produced by detector 24 (shown in FIG. 1A), such pulse 25 occurring at a position along the x axis of the screen 21 of the oscilloscope 20 which corresponds to the frequency ($f_c$). Another branch of coupler 12 is connected to a 3:1 power divider 14 and a plurality of signals of equal phase and equal amplitude are transmitted to coaxial connectors 52 of magnetometer 16. The upper and lower surfaces 29, 31 of magnetometer 16 are disposed orthogonally to the magnetic field produced by the North (N) pole 15 and South (S) pole 17, of a calibrating electromagnet 19. The current for the electromagnet 19 is adjusted by variable (DC) source 23 until a predetermined magnetic field of known strength ($H_{DC}$) is produced across the surfaces 29, 31 of the magnetometer 16. Magnetometer body member 30 is provided with a plurality of small cavities 32, 34 and 36 and small bodies of ferro- or ferrimagnetic material, such as YIG spheres 38 are mounted in each cavity (as shown in FIG. 3).

Figure 3:
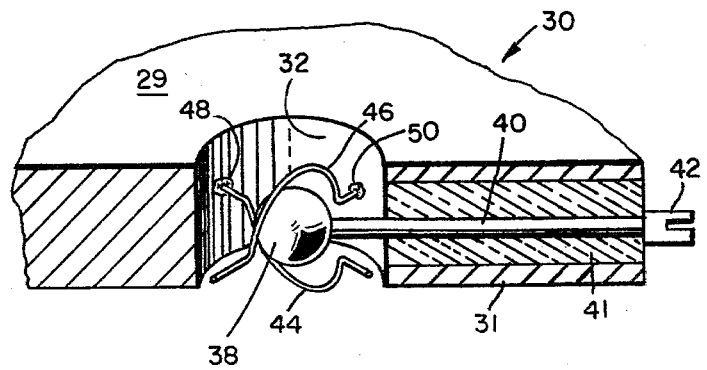
FIG. 3 is a fragmentary pictorial view of a portion of the magnetometer, partially in cross section, illustrating a YIG sphere in a cavity and radio frequency coaxial conductor structure.

Referring now to FIGS. 2 and 3 of the drawings, wherein like reference numerals designate like parts shown in FIG. 1 the illustration shown comprises a top view of magnetometer 16. Body member 30 comprises a single brass metal plate, here 0.060 inches thick, having an upper surface 29 and a lower surface 31 and defining microwave cavities 32, 34 and 36. Small YIG or gallium-doped YIG bodies, such as spheres 38, here approximately 0.010 inches in diameter are mounted in each cavity on dielectric rods 40 with screw means 42 for adjustment of the positioning of the rods and hence the position or orientation of the spheres 38 within the cavities, 32, 34, 36. Each sphere 38 is bonded to the dielectric rod 40, here of boron nitride, by a suitable epoxy. YIG spheres 38 are of a single crystal material and the preferred magnetic field alignment is along the "easy" crystalline axis direction: For the selected material such "easy" magnetization axis is along the body diagonal 111 crystal axis. One method of affixing the sphere 38 to rod 40 is referred to as magnetic levitation and comprises alternately applying a magnetic field from opposing directions along a horizontal plane until the sphere ceases to rotate, indicating alignment along the [111] axis. Rod 40 is then introduced vertically and axially along the perpendicular or face diagonal 110 crystalline directional and bonded to the sphere. Numerous other techniques for establishing the preferred orientation of the sphere 38 on rod 40 are well established and described in the art. See for example the text Microwave Filters, Impedance Matching Networks and Coupling Structures, Matthaei, Young and Jones, McGraw Hill, Inc. 1964, pps. 1040–1043, inclusive. Rod 40 has a diameter of approximately 0.005 to 0.020 inches and a hole is drilled in member 30 to accommodate the rod 40 and sphere 38 when inserted. A generally cylindrical dielectric insert 41 is provided within the passageway after the rod 40 and sphere 38 are inserted as shown in FIG. 3.

The radio frequency signals from power divider 14 (FIG. 1) are introduced to the cavity-sphere combinations by input coaxial connectors 52 and coaxial transmission lines. Each input coaxial waveguide line comprises a center conductor 44, preferably of copper, a silver-copper outer conductor 45 connected to connector 52 and a dielectric 47 such as Teflon (FIG. 2). Center conductors 44 pass from connector 52 to the wall of cavities 32, 34, 36 and are insulated from the body member 30 by dielectric 47, as shown. One end of center conductor 44 is secured for example by soldering to the cavity walls as at 48, as shown in FIG. 3. Output radio frequency signals from the cavity-sphere combinations are coupled by output coaxial waveguide transmission lines including a center conductor 46, insulated by dielectric 51 from body member 30 and the output conductor 49 of the coaxial conductors 54. The center conductors 46 are terminated similarly by soldering the ends thereof as at 50 to the cavity walls. The output radio frequency signals are converted by detectors 26 to video signals and transmitted by lines 28 for display on the $Y_1$, $Y_2$, $Y_3$ vertical axis of the screen 21 of oscilloscope 20 (FIG. 1).

In operation, referring again to FIGS. 1, 1A and 1B, the frequency of the modulated radio frequency signals transmitted from oscillator 10 to the cavities 32, 34, 36 periodically passes through frequency ($f_c$) and calibration spikes 25 appear on the oscilloscope screen 21 as previously described. The applied magnetic field ($H_{DC}$) produced by the calibrating electromagnet is adjusted by variable (DC) voltage source 23 so that such field is ($H_{DC}=f_c/\gamma$) and is uniform across the cavities 32, 34, 36. The output radio frequency signals from the cavities 32, 34, 36 are coupled by connectors 54 to matched detectors 26 which convert the signals to video signals for transmission by lines 28 for display on the $Y_1$, $Y_2$, $Y_3$ vertical axes respectively, of oscilloscope screen 21. Such signals appear as pulses 19, 19' and 19" as shown in FIG. 1A prior to calibration. It is noted that in the general case, prior to calibration, the signals coupled out of the cavities 32, 34, 36 will have frequencies other than the frequency ($f_c$). This is due to the fact that ferromagnetic resonance of the magnetized YIG material when radiated by radio frequency energy is influenced by: (1) the external and internal magnetic field environment; (2) magnetic anistrophy and (3) crystallographic axis orientation with respect to the field applied by the calibrating magnet. The output signals, initially pulses 19, 19', 19" (FIG. 1A) in the presence of the calibrated externally applied magnetic field ($H_{DC}$) produced by calibrating electromagnet 19 induces an internal demagnetization field N ($4\pi M$) opposing applied external field ($H_{DC}$); where ($4\pi M$) is the magnetic saturation and (N) is the demagnetization factor, (here $\frac{1}{3}$ for small spheres) for particular material having a particular orientation and geometry as is known M is related to the orientation of the cyrstallographic axis of the spheres relative to the direction of the magnetic field and is therefore also related to the orientation of the spheres in the cavities. The resultant internal field is [$H_I = H_{DC} - N (4\pi M)$]. Further detailed information and explanatory matter may be found in the text Microwave Ferrites and Ferrimagnetics, Lax and Button, McGraw-Hill Box Co. Inc. New York, N.Y. 1962, pgs. 80–84 and 157–168 inclusive.

In accordance with the invention and referring to FIGS. 1A and 1B, the orientation of spheres 38 is adjusted until the internal demagnetization field is zero and ($H_I = H_{DC}$); where ($H_I$) is the internal magnetic field and ($H_{DC}$) is the external applied field of the calibrating magnet. This condition is indicated when the pulse 19, 19' and 19" are displayed as sharp pulses or pips having a relatively narrow bandwidth at substantially the same reference frequency ($f_c$). Such pulses 19, 19' and 19" will then be in substantial alignment with pulses 25, as shown in FIG. 1B, and indicated by the vertical dashed line. The condition, shown in FIG. 1B, results therefore, when the spheres 38 are properly orientated in cavities 32, 34, 36 and each of the output signals has the same resonance frequency ($f_c$) represented in the equation ($f_c = \gamma H_{DC}$). The magnetometer is now considered to be calibrated and the orientation of the spheres 38 is now fixed with the cavities 32, 34, 36, as by applying a suitable bonding epoxy to the screw means 42, refer to FIG. 3.

Figure 4:
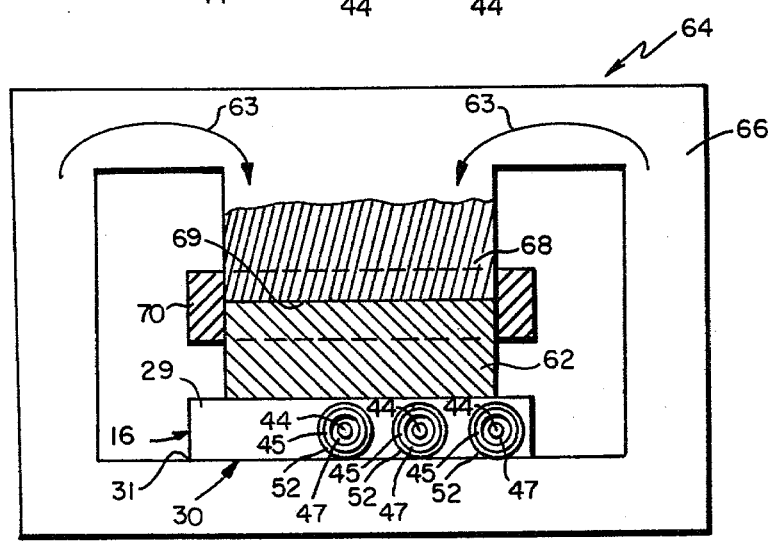
FIG. 4 is a side view of a test fixture for measurement of a permanent magnet using the method and apparatus according to the invention.

After the magnetometer 16 is calibrated, the magnetic field measurement of a permanent magnet sample, such as samarium cobalt 62 is performed by the removal of the adjustable electromagnet 19 and substitution of a test fixture 64, shown in FIG. 4, containing the magnet 62. Test fixture 64 comprises a yoke 66, with pole piece 68 and provides a return path (arrow 63) for the magnetic-field of magnet sample 62 along with the calibrated magnetometer 16. Surface 69 of the magnet 62 to be measured contacts the soft iron pole piece 68 and the magnetometer 16 is again located with the surfaces 29 and 31 orthogonal to the magnetic field of magnet 62. A temperature compensating ferrite shunt 70 may be employed in order to permit selection of magnets for operation over an extended temperature range. Shunt 70 is an annular ring fitted partially over magnet 62 and partially over pole piece 68.

The periodically linearly modulated radio frequency energy from oscillator 10 (FIG. 1) is reintroduced into the magnetometer cavities 32, 34, 36 with the spheres 38 fixed in the calibrated orientated position, described above. Referring now to FIG. 1C, the resonance frequencies of the output signals are determined by measuring the position of the pulses 27, 27', 27" on the screen 21 of oscilloscope 20. The degree to which the pulses 27, 27', 27" are displaced from the reference pulse 25 provides a ready indication of whether the magnet 62 being tested is acceptable or is not acceptable. The frequencies of the output signals are desirably similar to the frequencies ($f_c$), and pulse 25, for the calibrated spheres in cavities 32, 34, 36 to thereby indicate the condition for the magnetic field distribution and be used in measurement of magnet field strength of the magnet sample 62 being measured relative to the properties of the calibrating magnet.

The measured frequency provides a determination of the magnetic-field strength passing through each of the sphere-cavity combinations. Hence, if the frequency of the signal producing pulse 27 is determined as ($f_{m1}$), the strength of the portion of the magnetic field passing through cavity 32 or ($H_{M1}$) is derived from the equation ($H_{M1} = f_{M1}/\gamma$). Similarly the strengths of the portions of the magnetic field passing through cavities 34, 36 may be derived as ($H_{M2} = f_{M2}/\gamma$) and ($H_{M3} = f_{M3}/\gamma$) where ($f_{M2}$) is the frequency of the output signal emanating from cavity 34 and ($f_{M3}$) is the frequency of the output signal emanating from cavity 36. Plural bodies and cavities in the calibrated magnetometer, therefore, are indicative of magnetic field distribution across the permanent magnet being measured. Magnetic field strength of the permanent magnet being measured, however is achieved with at least one such body of a ferromagnetic resonance material in at least one cavity of a calibrated magnetometer.

In an alternative embodiment of the invention the apparatus described in connection with FIG. 1 may be used to determine the magnetic field distribution of a magnet. Here, during calibration the magnetic field passing through the cavities 32, 34, 36 is adjusted to provide a known field distribution. For example, consider that a calibrating magnet is used which provides a magnetic field distribution which increases linearly across the cavities 32, 34, 36. In other words the calibrating electromagnet produces a field of $H_o$ through cavity 32, $1.1H_o$ across cavity 34 and $1.2H_o$ across cavity 36. The orientation of the sphere in the cavities is adjusted so that the output signal produced by cavity 32 has a frequency $f_o$, the output signal produced by cavity 34 has a frequency $1.1f_o$ and the output signal produced by cavity 36 has a frequency $1.2f_o$. The spheres are now fixed in the orientation and the calibrating electromagnet is replaced with a magnet, the magnetic field strength distribution of which is to be measured. The frequencies of the output signals of cavities 32, 34, 36 are then measured. If the frequencies of the output signals of cavities 32, 34, 36 increase linearly then the field distribution of the magnet is known to also increase linearly across the cavities. Alternatively, during calibration the spheres may be orientated so that the frequencies of the output signals of cavities 32, 34, 36 are all equal with the calibrating magnet producing a linearly increasing magnetic field distribution across the cavities. Then, if a magnet, the magnetic field distribution of which is to be measured, is inserted in place of the calibrating magnet, it follows that if such magnet has a uniform field distribution across the cavities then each one of the frequencies of the signals produced by cavities 32, 34, 36 will be equal to one another. It is noted, however, that such frequency may not be the same as the frequency produced with the calibrating magnet unless the actual field passing through the cavities is the same for both the calibrating magnet and the substituted magnet.

It follows then that in the more general case the magnetometer 16 may be used to measure the field distribution of a magnet whether such magnet has a uniform, linear or non linear distribution. For example, if it is desired that the magnet have a particular field distribution a calibrating magnet is provided to produce this desired field distribution across the cavities. The spheres are then adjusted so that output signals are produced in the cavities to provide an indication of the field distribution; for example, the spheres may be oriented so that each of the output signals have the same frequency. The calibrating magnet is then replaced with the magnet which is to be measured. If the magnet has the desired field distribution across the cavities the frequencies of the output signal will be equal to each other. A measure of the deviation of the field distribution from the desired distribution is determined by the relative frequency differential between the frequencies of the output signals.

This completes the description of the method and apparatus for measuring magnetic field characteristics. It is understood that other materials may be employed in the magnetometer, such as ferrite, ferrimagnetic or ferromagnetic materials along with such metallic materials as nickel as long as such materials have the capability of producing ferromagnetic resonance in the presence of a magnetic field and radio frequency energy. Additionally, various modifications in the peferred embodiments, illustrated and described herein, may also be made by those skilled in the art without departing from the spirit and scope of the invention as expressed in the accompanying claims. Therefore, all matter shown and described is to be interpreted as illustrative only and not in a limiting sense.

What is claimed is:

1. A method of measuring a magnetic field comprising the steps of:
   (a) passing a magnetic field of a calibrating magnet through a cavity in an apparatus having disposed therein a material adapted to produce ferromagnetic resonance;
   (b) coupling radio frequency energy into said cavity;
   (c) positioning said material within said cavity to produce a first output signal having a frequency related to the magnetic field of the calibrating magnet passing into the cavity and through said material;
   (d) passing a second magnetic field to be measured into the cavity and through the positioned material;
   (e) coupling radio frequency energy into said cavity to generate a second output signal; and
   (f) comparing the frequency of the first output signal with the frequency of the second output signal to provide a measure of the second magnetic field.

2. A method of measuring magnetic field distribution comprising the steps of:
   (a) placing apparatus having a plurality of cavities with materials adapted to produce ferromagnetic resonance disposed in each cavity in a magnetic field of a calibrating magnet having a known magnetic field distribution across the cavities;
   (b) coupling radio frequency energy into the plurality of cavities and through the materials;
   (c) positioning the material within said cavities to produce a plurality of first output signals having frequencies related to the relative magnetic field distribution of the calibrating magnet passing through the cavities;
   (d) substituting a magnet whose magnetic field distribution is to be measured for the calibrating magnet;
   (e) coupling radio frequency energy into the plurality of cavities and through the positioned materials to generate a plurality of second output signals;
   (f) measuring the relative frequencies of the plurality of second output signals across said cavities and comparing the frequencies of such signals with the relative frequencies of the plurality of first output signals to determine the magnetic field distribution of the magnet being measured.

3. A method of measuring magnetic field strength comprising the steps of:
   (a) placing apparatus having a cavity with a material adapted to produce ferromagnetic resonance disposed therein in a magnetic field of a calibrating magnet having a predetermined magnetic field strength ($H_{DC}$);
   (b) coupling radio frequency energy into said cavity and through the material to generate a first output signal having a frequency related to the orientation of the material in said cavity;
   (c) positioning the material to a calibrated orientation position resulting in first output signals having a frequency ($f_c$) defined by the equation ($f_c = \gamma H_{DC}$) where $\gamma$ = the gyromagnetic ratio of the material (2.8 MHz/oersted);
   (d) substituting the magnetic field of a magnet having an unknown magnetic field strength ($H_M$) with the material in a calibrated position for the pedetermined magnetic field strength of the calibrating magnet;
   (e) coupling the radio frequency energy into the cavity and the material in the calibrated position to generate a second output signal having a measured frequency ($f_M$); and
   (f) determining the magnetic field strength ($H_M$) in accordance with the equation ($H_M = F_M/\gamma$).

4. A method of measuring a magnetic field comprising the steps of:
   (a) placing apparatus having a cavity with a material adapted to produce ferromagnetic resonance disposed therein in a magnetic field of a calibrating magnet;
   (b) transmitting radio frequency energy at a preselected frequency to display video means to generate a reference signal pulse;
   (c) coupling radio frequency energy in a predetermined range of frequencies including said reference frequency into said cavity to generate first output signals;
   (d) converting said first output signals to video frequencies and transmitting such video signal frequencies to means for display as video signal pulses;
   (e) adjusting the orientation of said material within said cavity until the first output signal pulses are in predetermined alignment with the reference signal pulse on the video display means, indicating the calibrated orientation of the material in the cavity relative to the magnetic field of the calibrating magnet passing through said cavity;
   (f) substituting a magnet whose magnetic field is to be measured with the material in a calibrated orientation relative to the magnetic field of the calibrating-magnet;
   (g) coupling the radio frequency energy into said cavity with the material in the calibrated position to generate second output signals for display on said video means; and
   (h) comparing the second video output pulses with the reference signal pulse to provide an indication of the magnetic field properties of the magnet being measured.

5. A method of measuring magnetic field strength and distribution comprising the steps of:
   (a) placing apparatus having a plurality of cavities with material adapted to produce ferromagnetic resonance disposed in each cavity in a magnetic field of a calibrating magnet having known properties ($H_{DC}$);
   (b) transmitting radio frequency energy at a preselected frequency to video display means to generate a reference signal pulse ($f_c$);
   (c) coupling modulated and sweeping radio frequency energy in a predetermined range of frequencies including said reference frequency into each of said cavities to generate first output signals;
   (d) converting said signals to video frequencies and transmitting said first video output signals to video display means for display as pulses;
   (e) adjusting the orientation of said material within said cavities until the first output signal pulses are in a predetermined array and alignment relative to said reference signal pulse on the video display means, indicating the calibrated orientation of the material in the cavities relative to the magnetic field of the calibrating magnet passing through each of said cavities, whereby the frequency ($f_c = \gamma H_{DC}$) where $\gamma$ = the gyromagnetic ratio (2.8 MHz/oersted) and $H_{DC}$ = the applied magnetic field of the calibrating magnet;

(f) substituting a magnet whose magnetic-field ($H_M$) is to be measured with the material in a calibrated orientation for the calibrating magnet;

(g) coupling the radio frequency energy into said cavities to generate second output signals, ($f_M$);

(h) converting said second output signals to video frequencies and transmitting said second video output signals to video display means for display as pulses; and (i) visually comparing the arrangement of the displayed second output signal pulses relative to first output signal pulses to ascertain the comparative magnetic field distribution of the magnet being measured relative to the field distribution of the calibrating magnet; and (j) measuring the magnetic field strength by application of the equation ($f_M = \gamma H_M$) where ($f_M$ = the ferromagnetic resonance of the material in the calibrated orientation in the magnetic-field of the magnet being evaluated; $\gamma$ = gyromagnetic ratio (2.8 MHz/oersted) and $H_M$ = applied magnetic field strength of the magnet to be measured.

6. The method according to claim 5 wherein said calibrating magnet comprises an electromagnet having a variable DC voltage source.

7. The method according to claim 5 wherein said material adapted to produce ferromagnetic resonance comprises yttrium iron garnet.

8. The method according to claim 5 wherein said magnet being measured is mounted adjacent to an annular ring of a temperature compensating ferrimagnetic material.

* * * * *